United States Patent
Zebedee (10) Patent No.: US 7,061,418 B2
(45) Date of Patent: Jun. 13, 2006

(54) DIGITAL/ANALOG CONVERTER, DISPLAY DRIVER AND DISPLAY

(75) Inventor: Patrick Zebedee, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/026,577

(22) Filed: Dec. 30, 2004

(65) Prior Publication Data

US 2005/0171991 A1    Aug. 4, 2005

(30) Foreign Application Priority Data

Jan. 3, 2004    (GB)    ................................ 0400040.2

(51) Int. Cl.
    *H03M 1/66* (2006.01)
(52) U.S. Cl. .............. 341/150; 341/144; 341/172
(58) Field of Classification Search ............. 341/150, 341/153, 138, 133, 156
    See application file for complete search history.

(56) References Cited

U.S. PATENT DOCUMENTS

| | | | | |
|---|---|---|---|---|
| 4,318,085 A | * | 3/1982 | Whiteside et al. | ........... 341/153 |
| 5,166,687 A | * | 11/1992 | Yung | ........................ 341/172 |
| 5,355,135 A | * | 10/1994 | Redfern | ..................... 341/156 |
| 5,631,650 A | * | 5/1997 | Hsu | .......................... 341/155 |
| 5,689,257 A | * | 11/1997 | Mercer et al. | ............. 341/133 |
| 5,889,486 A | * | 3/1999 | Opris et al. | ................ 341/150 |
| 6,154,121 A | * | 11/2000 | Cairns et al. | ............... 341/138 |
| 6,801,149 B1 | * | 10/2004 | Walton et al. | .............. 341/150 |
| 6,970,121 B1 | * | 11/2005 | Sun | ............................ 341/144 |

FOREIGN PATENT DOCUMENTS

GB    2 388 725    * 11/2003

* cited by examiner

*Primary Examiner*—Jean Bruner Jeanglaude
(74) *Attorney, Agent, or Firm*—Renner, Otto, Boisselle & Sklar, LLP (57) ABSTRACT

An n-bit digital/analog converter is provided for converting an n-bit digital word to a corresponding voltage. The converter comprises an (n−1) bit bufferless switched capacitor digital/analog converter (10) having an output ($V_{out}$) for direct connection to a capacitive load ($C_{LOAD}$). The (n−1) bit converter (10) also has first and second reference voltage inputs ($V_1$, $V_2$) and an (n−1) bit digital input. An (n−1) bit selective inverter ($13_1, \ldots, 13_{n-1}, 14_1, \ldots, 14_{n-1}$) supplies the (n−1) least significant bits to the digital input and inverts them if the most significant bit has a certain value. A switching arrangement (11, 12) connects the first and second reference voltage inputs ($V_1$, $V_2$) to receive first and second or second and first reference voltages depending on the value of the most significant bit.

15 Claims, 7 Drawing Sheets

FIG 6
Prior art ( from [3] )

Combination of
V01,V02,VC1,VC2
realizes three points
y ~ compensation

DIGITAL/ANALOG CONVERTER, DISPLAY DRIVER AND DISPLAY

FIELD OF THE INVENTION

The present invention relates to a digital/analog converter, to a display driver including such a converter, and to a display including such a driver. Such a converter may be used, for example, for driving matrix columns of a liquid crystal display. A particular application of such a converter is in small display panels for portable applications where power consumption is at a premium.

BACKGROUND OF THE INVENTION

Figure 1:
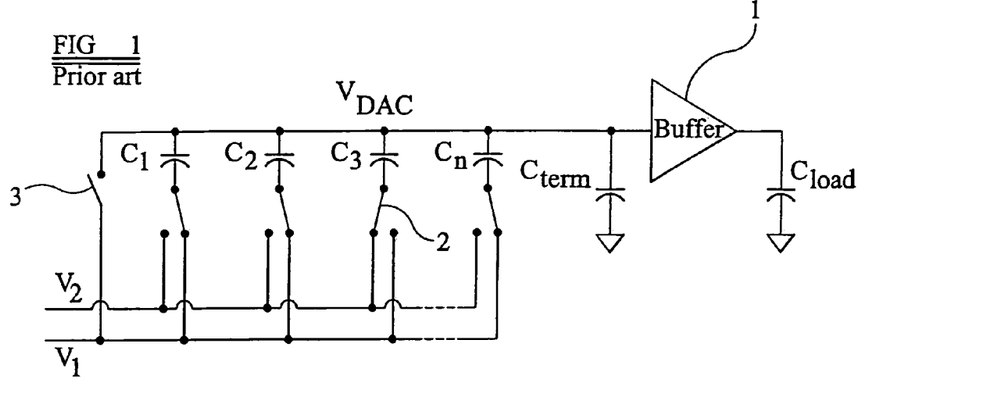
FIG. 1 is a simplified circuit diagram of a known DAC.

FIG. 1 of the accompanying drawings illustrates a known type of switched capacitor digital/analog converter (DAC) for converting an n-bit digital word to a corresponding analog output. The DAC comprises n-capacitors $C_1, \ldots, C_n$ with the capacitance $C_i$ of each ith capacitor being equal to $2^{(i-1)} C_1$. The DAC further comprises a terminating capacitor $C_{TERM}$ connected between the input of a unity gain buffer 1 and ground. The first electrodes of the capacitors $C_1, \ldots, C_n$ are connected together and to the first terminal of the terminating capacitor $C_{TERM}$. The second terminal of each of the capacitors $C_1, \ldots, C_n$ is connected to a respective switch, such as 2, which selectively connects the second electrode to a first or second reference voltage input $V_1$ or $V_2$ in accordance with the state or value of a corresponding bit of the digital word. The output of the buffer 1 drives a capacitive load $C_{LOAD}$, for example in the form of a data line or column electrode of an active matrix of a liquid crystal device.

The DAC has two phases of operation, namely a resetting or "zeroing" phase and a converting or "decoding" phase, controlled by internally generated timing signals which are not illustrated in FIG. 1. During the zeroing phase, the first and second electrodes of the capacitors $C_1, \ldots, C_n$ and the first electrode of the terminating capacitor $C_{TERM}$ are connected together by an electronic switch 3 and to the first reference voltage input $V_1$. The capacitors $C_1, \ldots, C_n$ are therefore discharged so that the total charge stored in the DAC is equal to $V_1 C_{TERM}$.

During the decoding phase, the second electrode of each capacitor $C_i$ is connected to the first reference voltage input $V_1$ or to the second reference voltage input $V_2$ according to the value of the ith bit of the digital input word. The charge stored in the DAC is given by:

$$Q = \sum_i b_i C_i (V_{DAC} - V_2) + \sum_i (1 - b_i) C_i (V_{DAC} - V_1) + V_{DAC} C_{TERM}$$

where $b_i$ is the ith bit of the input digital word and $V_{DAC}$ is the voltage at the first electrodes of the capacitors $C_1, \ldots, C_n$ and $C_{TERM}$. The output voltage is therefore given by:

$$V_{DAC} = V_{OUT} = \frac{\sum_i b_i C_i}{\sum_i C_i + C_{TERM}} (V_2 - V_1) + V_1$$

In general, $C_i = 2^{(i-1)} C_1$ and $C_1 = C_{TERM}$. This results in a set of output voltages which are linearly related to the input digital word.

In order to isolate the load capacitance from the DAC and to prevent it from affecting the conversion process, the unity gain buffer 1 is provided. However, such buffers are a substantial source of power consumption. If the buffer 1 were to be omitted, the terminating capacitance would be increased by the addition of the load capacitance so that the maximum output voltage from the DAC would be given by:

$$V_{OUT(MAX)} = \frac{\sum_i C_i}{\sum_i C_i + C_{TERM} + C_{LOAD}} (V_2 - V_1) + V_1$$

The effect of this may be reduced by increasing the value of the switched capacitors. However, this increases the power consumption of and the area of an integrated circuit occupied by the DAC. In order to achieve voltages near to the higher reference voltage, such as that supplied to the reference voltage input $V_2$, the capacitances must be increased substantially.

Another technique for compensating for this effect is to increase the higher reference voltage supplied to the input $V_2$. However, this also increases the power consumption of the DAC and may also require more complex or powerful circuitry to generate the higher reference voltage.

Figure 2:
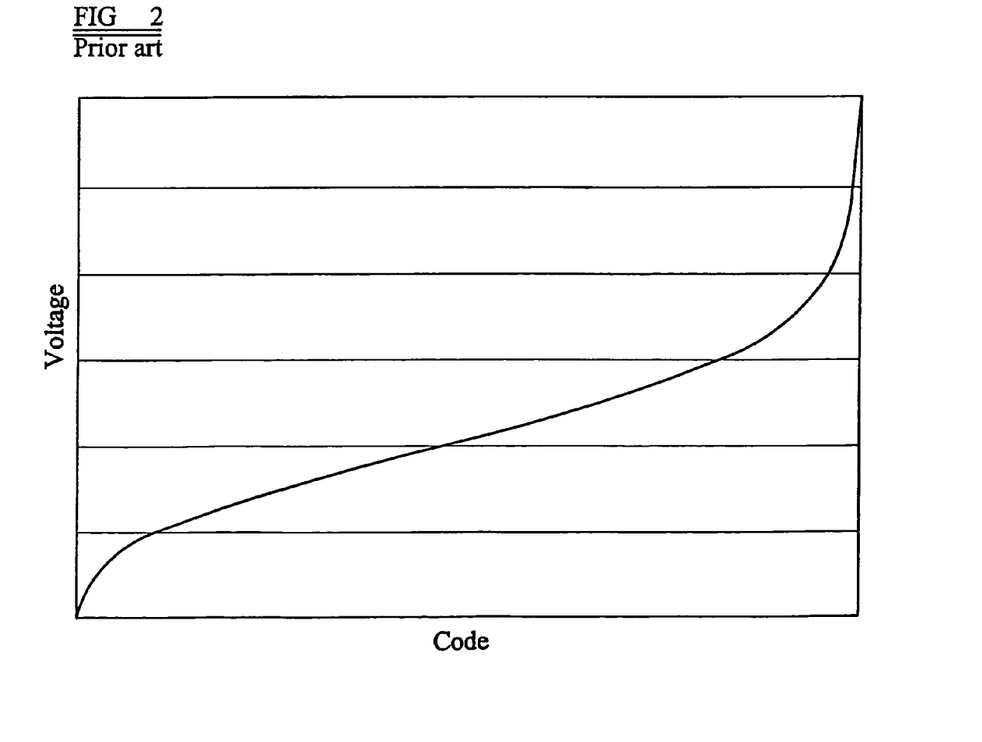
FIG. 2 is a graph of DAC output voltage against input digital code illustrating a required transfer characteristic for driving a typical liquid crystal display.
Figure 3:
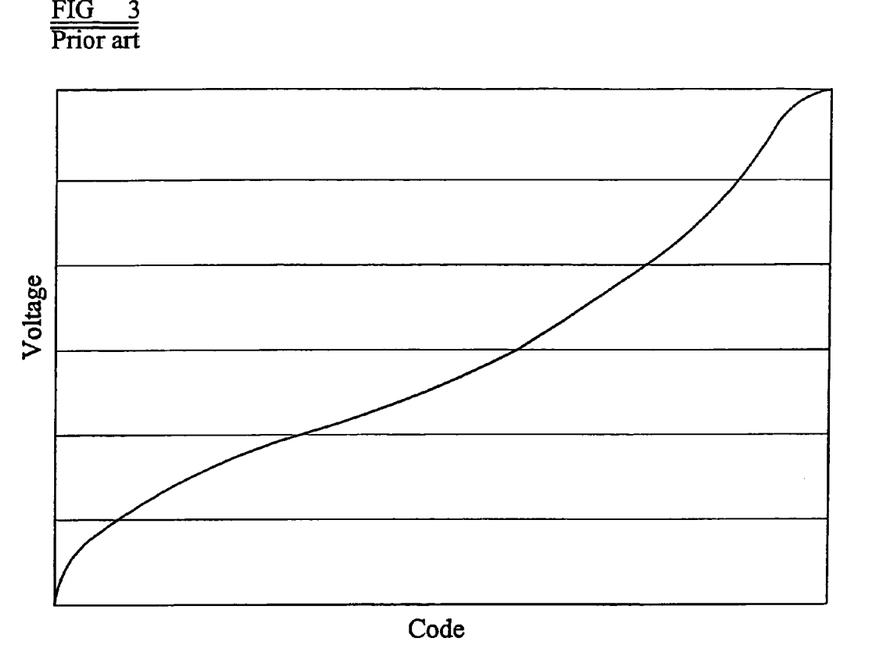
FIG. 3 is similar to FIG. 2 but illustrates the use of gamma correction with a gamma value of 2.2.
Figure 4:
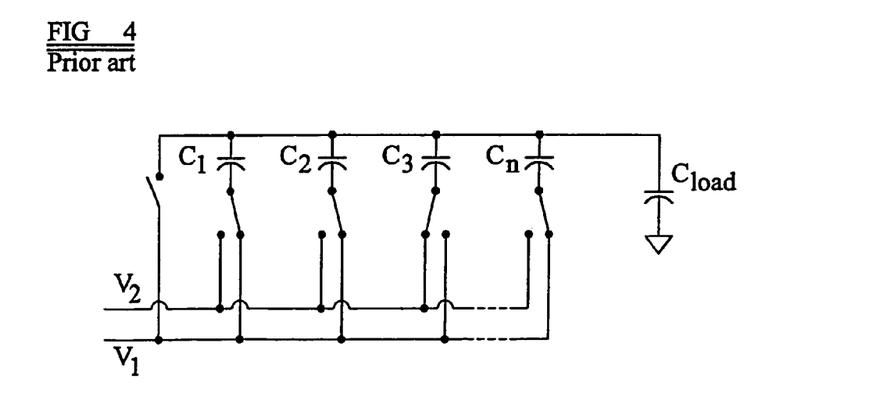
FIG. 4 is a simplified circuit diagram of another known DAC.
Figure 5:
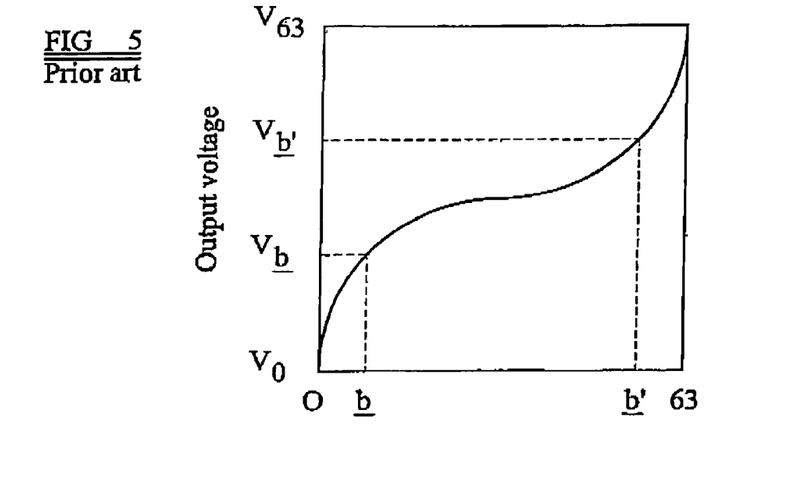
FIG. 5 is a graph similar to FIG. 2 but illustrating the rotational symmetry of the transfer function of the DAC of FIG. 4.

In some applications, DACs are required to generate an output voltage as a non-linear function of the input digital word. For example, FIG. 2 illustrates the required transfer function when a DAC is used as part of a driving arrangement for a liquid crystal display and FIG. 3 of the accompanying drawing illustrates how such a transfer function is modified in order to provide gamma correction. GB2388725 discloses a non-linear DAC in which non-linearity is achieved by providing switched capacitors which are not binary-weighted. By using such an arrangement with a relatively large terminating capacitor, it is possible to connect the DAC directly to the load and without an intermediate buffer as illustrated in FIG. 4 of the accompanying drawings. However, the same limit on the maximum output voltage as described hereinbefore applies to such an arrangement. Further, such a DAC is restricted to providing transfer characteristics with rotational symmetry. For example, in the case of a 6-bit converter within input words or codes in the range of 0 to 63, $V_b - V_0 = V_{63} - V_{b'}$, where b is a 6-bit digital code and b' is the ones complement thereof as illustrated in FIG. 5 of the accompanying drawings. Thus, although a DAC of this type can approximate the curve illustrated in FIG. 2, in general it cannot adequately approximate non-symmetrical curves such as that illustrated in FIG. 3.

ACKNOWLEDGEMENT OF THE PRIOR ART

Figure 6:
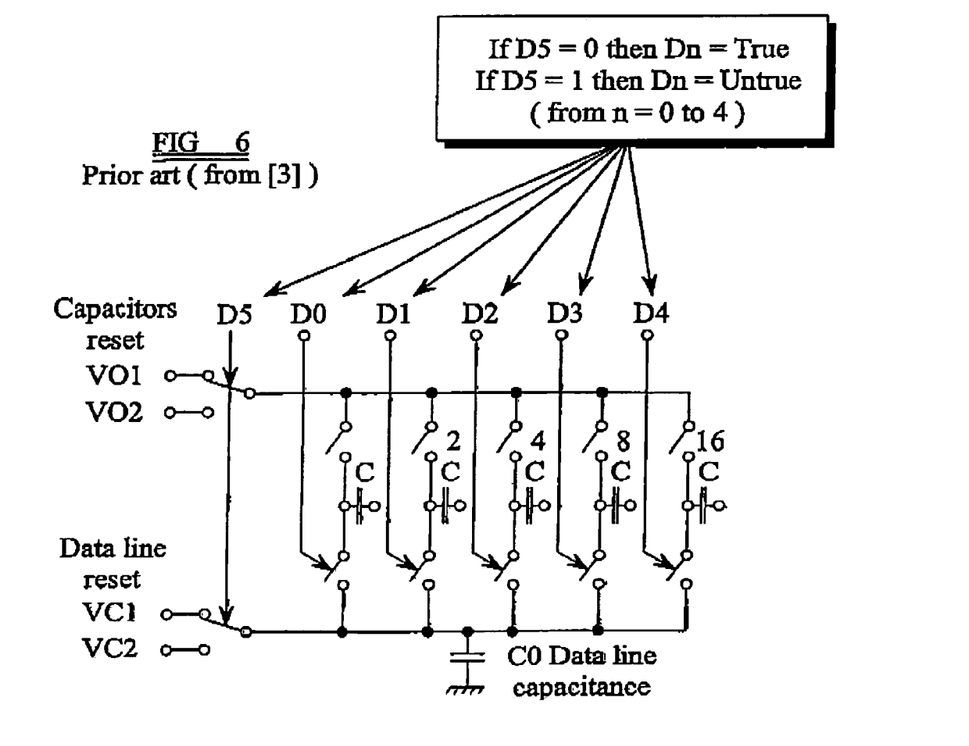
FIG. 6 is a circuit diagram of a further known DAC.

FIG. 6 of the accompanying drawings illustrates a non-linear DAC of the type disclosed in U.S. Pat. No. 6,380,917 and in Matsueda et al, "A 6-bit-colour low temperature poly-SiTFT-LCD with integrated digital data drivers", SID '98 digest, pp. 879–882. Such a non-linear DAC may be used to approximate the transfer characteristics of liquid crystal devices. The 6-bit example illustrated in FIG. 6 does not require a buffer or terminating capacitor and comprises five binary-weighted capacitors whose connections are controlled by signals derived from the five least significant bits of the input word.

The most significant bit D5 controls the selection of reference voltage sources VO1, VO2, VC1 and VC2.

During a zeroing phase, the first electrode of the load capacitance (illustrated as a data line capacitance in FIG. 6) is charged to the reference voltage VC1 or VC2 depending on the value of the most significant bit and the first electrodes of the switched capacitors are discharged to the reference voltage VO1 or VO2 similarly depending on the value of the most significant bit. If the value of the most significant bit D5 is zero, the five least significant bits are supplied without inversion whereas, if the value of the most significant bit is 1, the five least significant bits are inverted. During the decoding phase, the first electrode of the load capacitance is connected to the first electrodes of a selection of the switched capacitors controlled by the inverted or non-inverted values of the five least significant bits. The resulting output voltage of the DAC is given by:

$$V_{OUT} = \frac{V_{C1}C_{LOAD} + V_{01}\sum_i b_i C_i}{\sum_i b_i C_i + C_{LOAD}}$$

Figure 7:
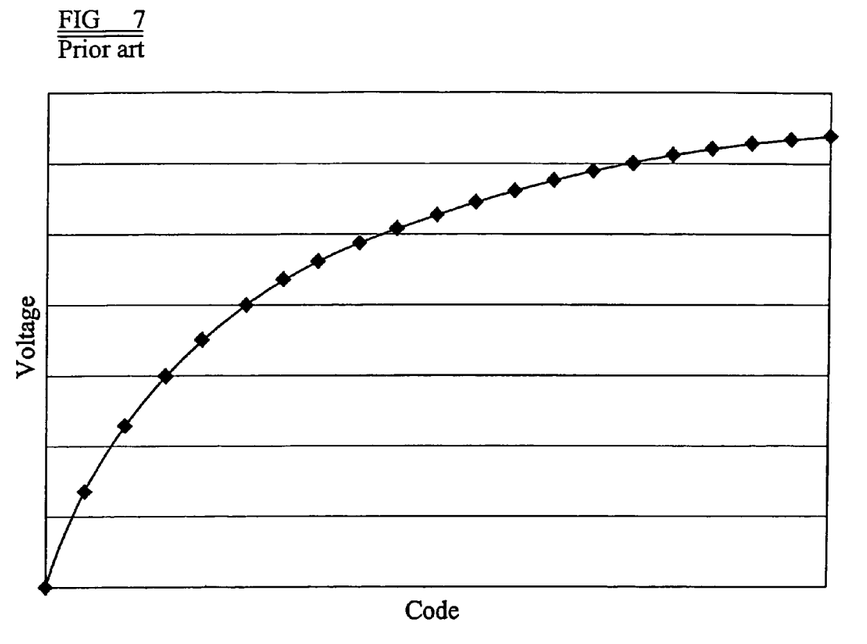
FIGS. 7 and 8 are graphs similar to FIG. 2 illustrating typical transfer functions of the DAC of FIG. 6.
Figure 8:
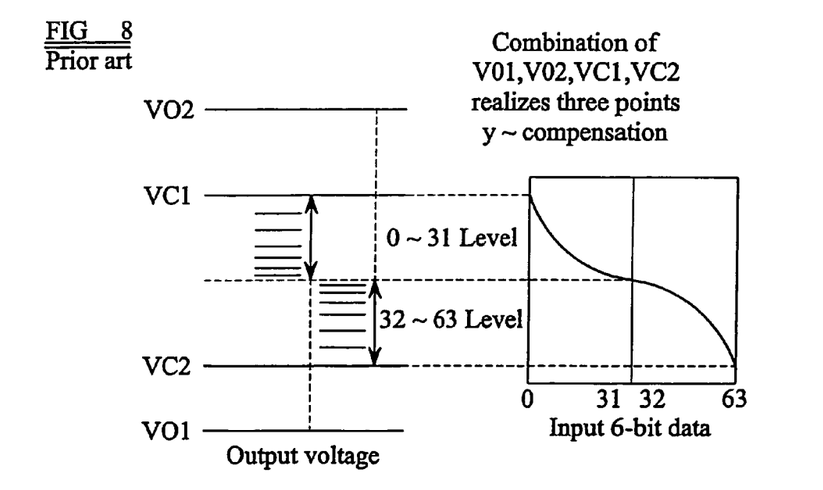

The transfer function is inherently non-linear and is of the form illustrated in FIG. 7 of the accompanying drawings. Using the most significant bit to control the reference voltages and inversion of the least significant bits effectively provides two output curves, which may be combined as illustrated in FIG. 8 of the accompanying drawings, with rotational symmetry.

The range of transfer characteristics or curves which can be provided by such a DAC is limited to curves of the same general shape although the gradient may be selected by the appropriate selection of capacitance values within the DAC. Also, four reference voltages, some of which are beyond the range of required output voltages, are required. Such an arrangement therefore has the same disadvantages as mentioned hereinbefore.

SUMMARY OF THE INVENTION

According to a first aspect of the invention, there is provided an n-bit digital/analog converter for converting an n-bit digital word, were n is an integer greater than 1, comprising: an (n−1) bit bufferless switched capacitor digital/analog converter having an output for direct connection to a capacitive load, first and second reference voltage inputs, and an (n−1) bit digital input; an (n−1) bit selective inverter for supplying to the (n−1) bit digital input the (n−1) least significant bits of the n-bit digital word without inversion when the most significant bit of the n-bit digital word has a first value and with inversion when the most significant bit has a second value different from the first value; and a switching arrangement for connecting the first and second reference voltage inputs to receive first and second reference voltages, respectively, when the most significant bit has the first value and to receive the second and first reference voltages, respectively, when the most significant bit has the second value.

The (n−1) bit converter may comprise (n−1) capacitors whose first electrodes are connected together for connection to the capacitive load. The second electrode of each ith capacitor may be arranged to be connected to the first or second reference voltage input when the ith bit of the (n−1) least significant bits has the first or second value, respectively. The (n−1) bit converter may have a resetting mode in which the first and second electrodes of the capacitors are connected to the first reference voltage input. Each ith capacitor may have a value $C_i$ given by $C_i = a^{(i-1)}C_1$ for $1 < i \leq (n-1)$, where a is a positive real number. For example, a may be equal to 2.

The first value may be 0.

The second reference voltage may be greater than the first reference voltage.

The selective inverter may comprise a multiplexing arrangement. As an alternative, the selective inverter may comprise a first memory containing a first look-up table representing a first function addressed by the n-bit digital word. As a further alternative, the selective inverter may comprise (n−1) Exclusive-OR gates, each of which has a first input for receiving the most significant bit and a second input for receiving a respective one of the (n−1) least significant bits.

The converter may comprise a second memory containing a second look-up table representing a second non-linear function addressed by the n-bit digital word.

According to a second aspect of the invention, there is provided a display driver comprising at least one converter according to the first aspect of the invention.

According a third aspect of the invention, there is provided a display comprising a driver according to the second aspect of the invention.

The display may comprise a liquid crystal device.

It is thus possible to provide a converter which does not require a buffer and hence is of lower power consumption. The transfer function of the converter may be linear or non-linear and only two reference voltages are required. These reference voltages may be at the limits of the required output range and are simple to generate with relatively low power consumption. The converter does not have to "dominate" the size of a capacitive load so that integration area can be reduced, power consumption can be reduced and speed of conversion can be increased.

BRIEF DESCRIPTION OF THE DRAWINGS

The invention will be further described, by way of example, with reference to the accompanying drawings, in which.

DETAILED DESCRIPTION OF THE PREFERRED EMBODIMENTS

Figure 9:
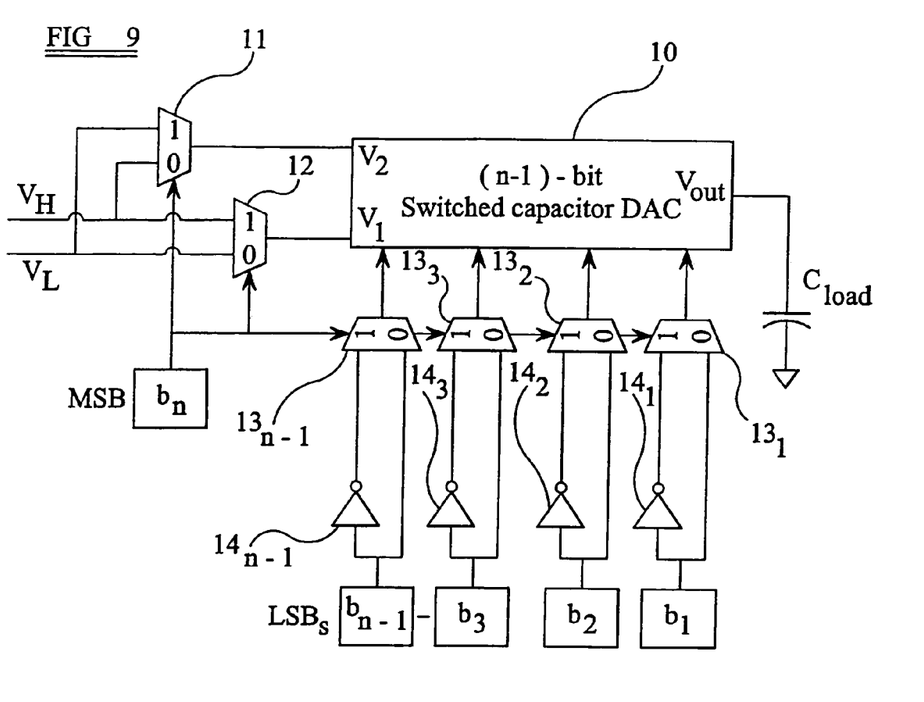
FIG. 9 is a block circuit diagram of a DAC constituting an embodiment of the invention.

The DAC shown in FIG. 9 converts n-bit input words or codes to an output voltage range between and including a lower reference voltage $V_L$ and a higher reference voltage $V_H$. The DAC comprises an (n–1) bit switched capacitor DAC 10 of the bufferless type with an output $V_{OUT}$ connected directly to a capacitive load $C_{LOAD}$, for example comprising a data line of an active matrix liquid crystal device. The DAC 10 has reference voltage inputs $V_1$ and $V_2$ connected to the outputs of 2-input multiplexers 11 and 12 acting as electronic changeover switches controlled by the most significant bit (MSB) $b_n$. First inputs of the multiplexers 11 and 12 are connected to receive the reference voltages $V_L$ and $V_H$, respectively, whereas second inputs thereof are connected to receive the reference voltages $V_H$ and $V_L$, respectively. When the value of the most significant bit $b_n$ is 0, the inputs $V_1$ and $V_2$ are connected by the multiplexers to receive the reference voltages $V_L$ and $V_H$. Conversely, when the most significant bit $b_n$ is 1, the multiplexers supply the reference voltages $V_H$ and $V_L$ to the inputs $V_1$ and $V_2$, respectively.

The most significant bit also controls an (n–1) bit selective inverter comprising two-input multiplexers $13_1, \ldots, 13_{n-1}$ and inverters $14_1, \ldots, 14_{n-1}$. Each of the multiplexers has a first input, which receives the value of the corresponding bit of the (n–1) least significant bits of the input word, and a second input which receives the inverted bit via the corresponding inverter. The multiplexers $13_1, \ldots, 13_{n-1}$ act as electronic changeover switches controlled by the value of the most significant bit. Thus, when the value of the most significant bit $b_n$ is 0, the (n–1) least significant bits are not inverted whereas, when the value of the most significant bit $b_n$ is 1, the (n–1) least significant bits are inverted before being supplied to the DAC 10.

Figure 10:
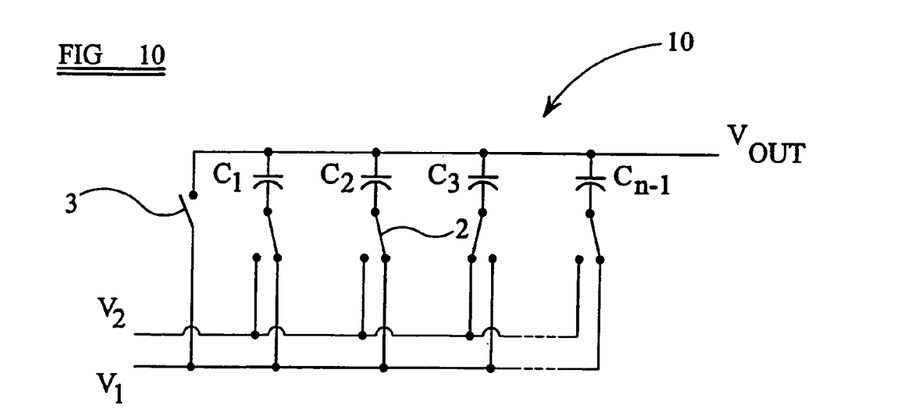
FIG. 10 is a simplified circuit diagram of part of the DAC of FIG. 9.

The DAC 10 is shown in more detail in FIG. 10 and is of the bufferless type as illustrated in FIG. 4. Also, no internal terminating capacitor is provided. Instead, as in FIG. 4, the capacitive load $C_{LOAD}$ acts as the terminating capacitor. The capacitance $C_i$ of each capacitor other than the first is equal to the product of the value of the first capacitor $C_1$ and $2^{(i-1)}$. Also, the sum of the capacitances of the switched capacitors in the DAC 10 is made equal to the load capacitance $C_{LOAD}$.

The maximum output voltage of the converter shown in FIG. 9 is given by:

$$V_{OUT(MAX)} = \frac{\sum_i C_i}{\sum_i C_i + C_{LOAD}}(V_2 - V_1) + V_1$$

$$= \frac{1}{2}(V_2 + V_1)$$

so that the output of the converter is in the range from the voltage at the first reference voltage input $V_1$ to half sum of the reference voltage inputs $V_1$ and $V_2$. Thus, when the most significant bit $b_n$ of the input word is 0, the output ranges up from $V_L$ to $$\frac{1}{2}(V_H + V_L).$$

When the most significant bit is 1, the output ranges from $V_H$ down to $$\frac{1}{2}(V_H + V_L).$$

Figure 11:
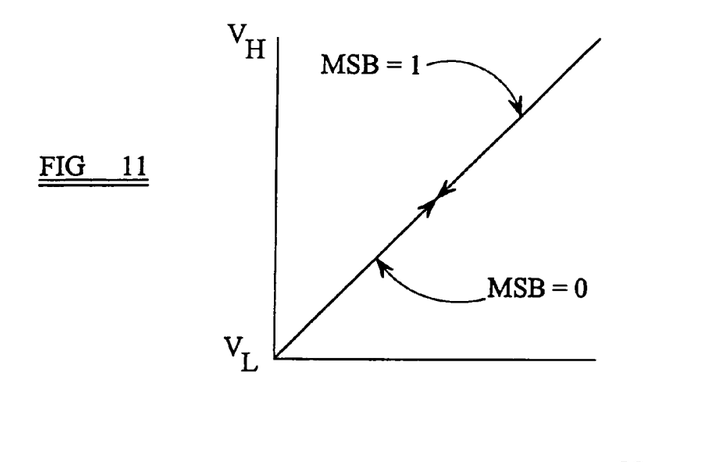
FIG. 11 is a graph illustrating the output range of the DAC of FIG. 9.

Thus, the output voltage of the converter shown in FIG. 9 ranges from $V_L$ to $V_H$ as illustrated in FIG. 11 so that the reference voltages are at the ends of the range. Generation of the reference voltages is therefore relatively simple and the power required to generate these voltages is substantially minimised. Arranging the converter to suit different output requirements is relatively easy and may involve simply changing the reference voltages to match the required output range.

It is not necessary to provide an output buffer so that what is generally the largest power consumer in a converter, for example, of the type shown in FIG. 1 can be omitted.

The transfer function of the converter may be linear or non-linear depending on the choice of values of the switched capacitors. For example, the binary-weighted capacitance values described hereinbefore may be replaced by other values, such as $C_i = a^{(i-1)} C_1$, where a is a positive real number, by values which are not linearly scaled, by equal values, or by any suitable values for a desired application. Non-linear transfer functions can be provided, for example, by suitable capacitance values and/or by means of look-up tables as described hereinafter.

Only two reference voltages are required and the converter does not have to "dominate" the capacitance of the load. Thus, it is possible to reduce the integration area required for such a converter. Also, power consumption can be substantially reduced and speed of conversion can be increased.

Figure 12:
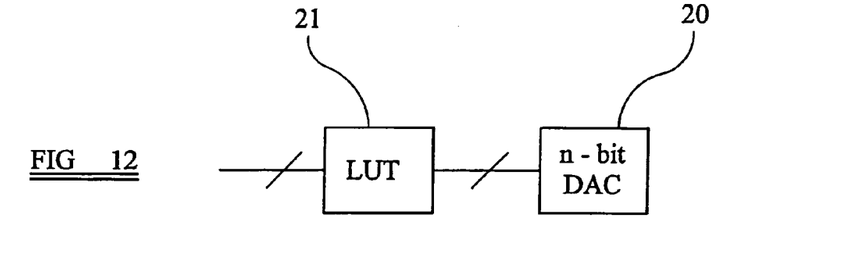
FIG. 12 illustrates the use of a look-up table with the DAC of FIG. 9 to provide a non-linear transfer characteristic.

FIG. 12 illustrates a technique for providing a non-linear transfer function with an n-bit DAC 20 of the type shown in FIGS. 9 and 10. A look-up table 21, for example stored in a non-volatile memory, is provided between an m-bit input for receiving m-bit digital words for conversion and the n-bit input of the converter 20. The look-up table 21 acts as non-linear transfer function so that this combined with the linear transfer function of the converter 20 provides a non-linear overall transfer function.

If m is less than n, then the transfer function effectively makes a selection from the range of possible output voltages. If m is equal to n, then the look-up table may reorder and/or combine some codes to provide the non-linear transfer function. If m is greater than n, the look-up table permits the use of a lower resolution converter in a higher resolution system but with a loss of resolution.

The transfer function of the converter 20 does not have to be linear and may therefore be non-linear.

Figure 13:
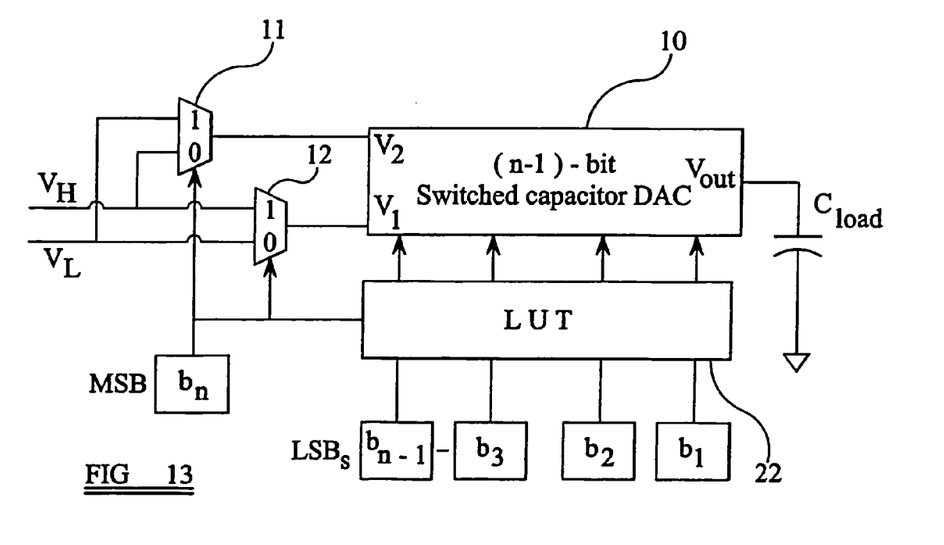
FIG. 13 is a block circuit diagram of a converter constituting another embodiment of the invention.

The converter shown in FIG. 13 differs from that shown in FIGS. 9 and 10 in that the arrangement for selectively inverting the (n–1) least significant bits of the input word comprises another look-up table 22, for example stored in a non-volatile memory. The look-up table 22 is addressed by the n-bit input word and represents a function which inverts the (n–1) least significant bits if the most significant bit is 1.

As an alternative, the selective inversion of the (n–1) least significant bits may be combined with other logical functions in the converter. For example, this may be combined with clock signals for controlling the operation of the switches within the converter 10.

Figure 14:
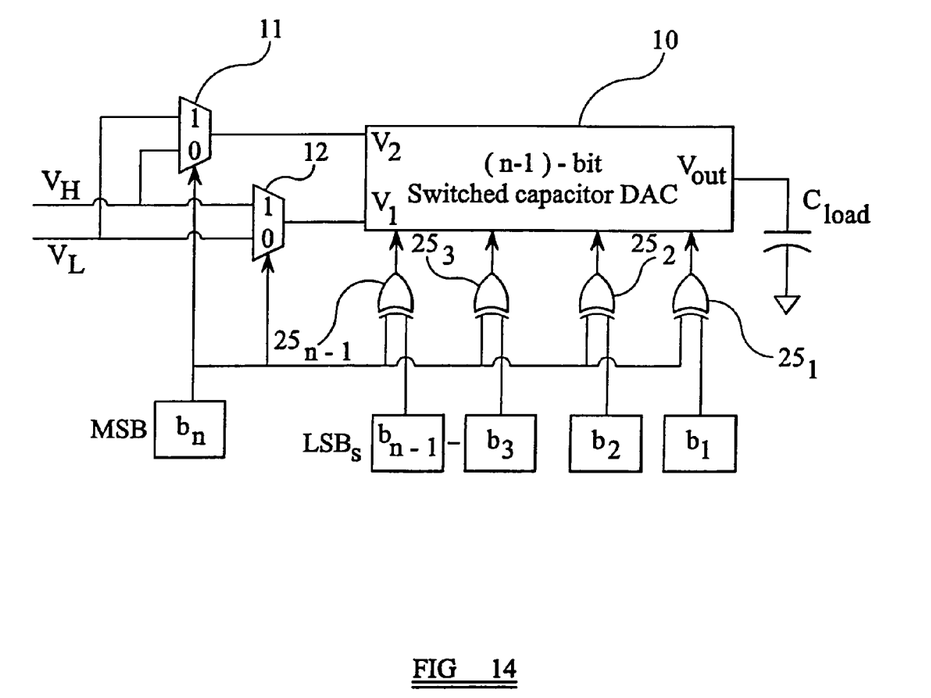
FIG. 14 is a block circuit diagram of a converter constituting a further embodiment of the invention.

The converter shown in FIG. 14 differs from those shown in FIGS. 9, 10 and 13 in that the arrangement for selectively inverting the (n−1) least significant bits of the input word comprises (n−1) Exclusive-OR gates $25_1, \ldots, 25_{n-1}$. Each of the gates has a first input which receives the most significant bit and a second input which receives a respective one of the (n−1) least significant bits. When the most significant bit is 1, the gates $25_1, \ldots, 25_{n-1}$ invert the n (n−1) least significant bits whereas, when the most significant bit is 0, the gates pass the (n−1) least significant bits without inversion in accordance with the following truth table:

| MSM $b_n$ | LSB $b_i$ | Ex-OR output |
|---|---|---|
| 0 | 0 | 0 |
| 0 | 1 | 1 |
| 1 | 0 | 1 |
| 1 | 1 | 0 |

The invention claimed is:

1. An n-bit digital/analog converter for converting an n-bit digital word, where n is an integer greater than one, comprising: an (n−1) bit bufferless switched capacitor digital/analog converter having an output for direct connection to a capacitive load, first and second reference voltage inputs, and an (n−1) bit digital input; an (n−1) bit selective inverter for supplying to the (n−1) bit digital input the (n−1) least significant bits of the n-bit digital word without inversion when the most significant bit of the n-bit digital word has a first value and with inversion when the most significant bit has a second value different from the first value; and a switching arrangement for connecting the first and second reference voltage inputs to receive first and second reference voltages, respectively, when the most significant bit has the first value and to receive the second and first reference voltages, respectively, when the most significant bit has the second value.

2. A converter as claimed in claim 1, in which the (n−1) bit converter comprises (n−1) capacitors whose first electrodes are connected together for connection to the capacitive load.

3. A converter as claimed in claim 2, in which the second electrode of each ith capacitor is arranged to be connected to the first or second reference voltage input when the ith bit of the (n−1) least significant bits has the first or second value, respectively.

4. A converter as claimed in claim 2, in which the (n−1) bit converter has a resetting mode in which the first and second electrodes of the capacitors are connected to the first reference voltage input.

5. A converter as claimed in claim 2, in which each ith capacitor has a value $C_i$ given by $C_i = a^{(i-1)} C_1$ for $1 < i \leq (n-1)$, where a is a positive real number.

6. A converter as claimed in claim 5, in which a=2.

7. A converter as claimed in claim 1, in which the first value is 0.

8. A converter as claimed claim 1, in which the second reference voltage is greater than the first reference voltage.

9. A converter as claimed in claim 1, in which the selective inverter comprises a multiplexing arrangement.

10. A converter as claimed in claim 1, in which the selective inverter comprises a first memory containing a first look-up table representing a first function addressed by the n-bit digital word.

11. A converter as claimed in claim 1, in which the selective inverter comprises (n−1) Exclusive-OR gates, each of which has a first input for receiving the most significant bit and a second input for receiving a respective one of the (n−1) least significant bits.

12. A converter as claimed in claim 1, comprising a second memory containing a second look-up table representing a second non-linear function addressed by the n-bit digital word.

13. A display driver comprising at least one converter as defined in claim 1.

14. A display comprising a driver as defined in claim 13.

15. A display as claimed in claim 14, comprising a liquid crystal device.

* * * * *